United States Patent [19]
Suzuki et al.

[11] Patent Number: 5,228,928
[45] Date of Patent: Jul. 20, 1993

[54] METHOD OF MANUFACTURING $Nb_3Sn$ SUPERCONDUCTING WIRE

[75] Inventors: Takuya Suzuki; Kinya Ogawa; Sakaru Endoh; Kyota Susai, all of Tokyo, Japan

[73] Assignee: The Furukawa Electric Co., Ltd., Tokyo, Japan

[21] Appl. No.: 831,401

[22] Filed: Feb. 5, 1992

[30] Foreign Application Priority Data

Feb. 7, 1991 [JP] Japan .................. 3-38123

[51] Int. Cl.$^5$ .................. H01B 12/10
[52] U.S. Cl. .................. 148/98; 505/921
[58] Field of Search .................. 148/98; 505/919, 921

[56] References Cited

U.S. PATENT DOCUMENTS

| | | | |
|---|---|---|---|
| 3,918,998 | 11/1975 | Marancik et al. | 505/919 |
| 4,377,905 | 3/1983 | Agatsuma et al. | 29/599 |
| 4,860,431 | 8/1989 | Marancik et al. | 29/599 |

FOREIGN PATENT DOCUMENTS

| | | |
|---|---|---|
| 0234071 | 9/1987 | European Pat. Off. . |
| 62-93354 | 4/1987 | Japan . |
| 62-93355 | 4/1987 | Japan . |

OTHER PUBLICATIONS

Patent Abstracts of Japan, vol. 4, No. 19 (C-073) Feb. 16, 1980 of JP-A-54-157 761.
Proceedings of the IEEE, vol. 77, No. 8, Aug. 1989, New York, U.S., pp. 1110-1123, Gregory, E. et al., "Conventional Wire and Cable Technology".
Scientific American, vol. 243, No. 5, Nov. 1980, New York, U.S., pp. 112-136, Gabelle, T. H. et al., "Superconductors in Electric-Power Technology".
Patent Abstracts of Japan, vol. 15, No. 412 (E-1124), Oct. 21, 1991 of JP-A-3-1 71 516 (National Research Institute for Metals).

*Primary Examiner*—George Wyszomierski
*Attorney, Agent, or Firm*—Frishauf, Holtz, Goodman & Woodward

[57] ABSTRACT

A method of manufacturing an $Nb_3Sn$ superconducting wire includes the steps of composing a desired number of rods, constituted by a material selected from the group consisting of Nb and an Nb alloy, in a Cu-Sn-based alloy matrix containing 15.1 to 24.6 wt % of Sn, thus forming a composite billet, subjecting the composite billet to hot working, subjecting the composite billet to cold or warm working to reduce a diameter and annealing repeatedly to divide an intermetallic compound phase in the Cu-Sn-based alloy into small pieces, thus obtaining a composite wire, and subjecting the composite wire to predetermined heating to diffuse Sn in Nb. A method of manufacturing an $Nb_3Sn$ superconducting wire includes the steps of inserting a multiple of composite wires in a pipe, constituted by a material selected from the group consisting of Cu and a Cu alloy, and composing the multiple of composite wires to form a multi-core composite billet, drawing the multi-core composite billet to obtain a multi-core composite wire, and subjecting the multi-core composite wire to predetermined heating to diffuse Sn in Nb.

20 Claims, 1 Drawing Sheet

METHOD OF MANUFACTURING NB₃SN SUPERCONDUCTING WIRE

BACKGROUND OF THE INVENTION

1. Field of the Invention

The present invention relates to a method of manufacturing an Nb$_3$Sn superconducting wire having an excellent superconducting property.

2. Description of the Related Art

In the manufacture of Nb$_3$Sn superconducting wires, since an Nb$_3$Sn compound is brittle, methods, e.g., a composite processing method, an internal Sn method, and a tube method of basically producing an Nb$_3$Sn phase in the final stage have been developed.

In the composite processing method of the methods described above, as shown in FIG. 1A, a through hole is formed in a Cu-Sn-based alloy billet 1. An Nb rod 2 is inserted in this through hole to form a composite billet 3. This composite billet 3 is subjected to drawing to form a composite wire 5. At this time, a bronze layer 4 constituted by a Cu-Sn-based alloy covers the circumferential surface of the Nb rod 2, as shown in FIG. 1B. Finally, the composite wire 5 is subjected to a predetermined heating process to diffuse Sn in the bronze layer 4 to the Nb rod 2, so that an Nb$_3$Sn phase 6 is produced at the interface between the bronze layer 4 and the Nb rod 2, thus obtaining an Nb$_3$Sn superconducting wire 7 as shown in FIG. 1C. The superconducting wire obtained in this method is electromagnetically stable as the Nb$_3$Sn phase is composed in the bronze layer. Therefore, this superconducting wire is advantageous in that it can be magnetized quickly, and is thus widely used in practice.

However, the Sn content in the Cu-Sn-based alloy billet used in the above composite processing method is controlled to an amount within a range of a solid solution in Cu considering the workability, that is, the Sn content is controlled not to exceed 15.1 wt %. As a result, the amount of produced Nb$_3$Sn phase is limited and a good superconducting property such as a high critical current density (Jc) cannot be obtained.

SUMMARY OF THE INVENTION

It is an object of the present invention to provide a method of manufacturing an Nb$_3$Sn superconducting wire, which can efficiently manufacture an Nb$_3$Sn superconducting wire having a high superconducting property.

The present inventors have found that when drawing is performed while dividing an intermetallic compound in the Cu-Sn-based alloy after hot working of Cu-Sn-based alloy, even if a Cu-Sn-based alloy containing Sn in an amount exceeding the solid solution limit is used, a resultant composite wire has a sufficiently high deformability, and has made extensive studies on this to complete the present invention.

More specifically, the above object is achieved by a method of manufacturing an Nb$_3$Sn superconducting wire, including the steps of: composing a desired number of rods, constituted by a material selected from the group consisting of Nb and an Nb alloy, in a Cu-Sn-based alloy matrix containing 15.1 to 24.6 wt % of Sn, thus forming a composite billet; subjecting the composite billet to hot working; subjecting the composite billet to cold or warm working to reduce a diameter and annealing repeatedly to divide an intermetallic compound phase in the Cu-Sn-based alloy into small pieces, thus obtaining a composite wire; and subjecting the composite wire to predetermined heating to diffuse Sn in Nb.

The above object is also achieved by a method of manufacturing an Nb$_3$Sn superconducting wire, including the steps of: composing a desired number of rods, constituted by a material selected from the group consisting of Nb and an Nb alloy, in a Cu-Sn-based alloy matrix containing 15.1 to 24.6 wt % of Sn, thus forming a composite billet; subjecting the composite billet to hot working; subjecting the composite billet to cold or warm working to reduce a diameter and annealing repeatedly to divide an intermetallic compound phase in the Cu-Sn based alloy into small pieces, thus obtaining a composite wire; inserting a multiple of composite wires in a pipe, constituted by a material selected from the group consisting of Cu and a Cu alloy, and composing the multiple of composite wires to form a multi-core composite billet; drawing the multi-core composite billet to obtain a multi-core composite wire; and subjecting the multi-core composite wire to predetermined heating to diffuse Sn in Nb.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Figure 1A:
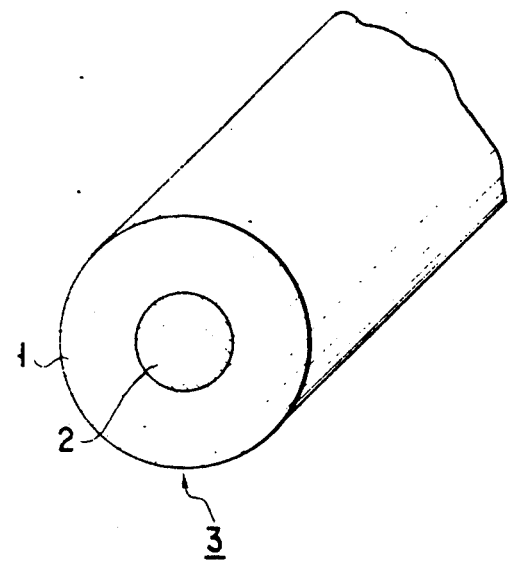
FIGS. 1A to 1C are perspective sectional views for explaining the processes for manufacturing an Nb$_3$Sn superconducting wire.
Figure 1B:
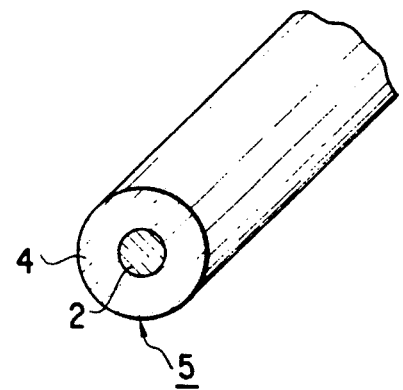
Figure 1C:
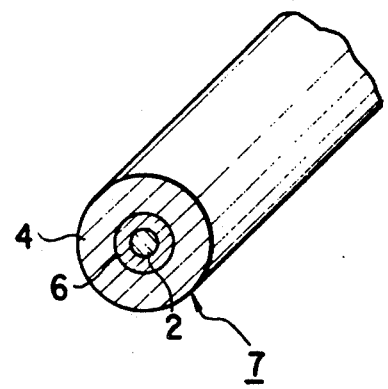

In the present invention, hot working is performed, and cold working and annealing are repeated to divide an intermetallic compound phase in the Cu-Sn-based alloy into small pieces. That is, the intermetallic compound phase is divided by cold working. A new α-phase interface is formed between the δ-phase and the α-phase. In the new α-phase interface, since an amount of Sn in the α-phase is less than the solid solution limit, Sn diffuses from the δ-phase to the α-phase. Thus, the δ-phase is reduced and joined to the new α-phase.

For this reason, even if the content of Sn in the Cu-Sn based alloy of the composite billet made of an Cu-Sn alloy and an Nb rod is increased to 15.1 to 24.6 wt %, the composite billet can be drawn. When a composite wire obtained by drawing is heated to a predetermined temperature, a large amount of Nb$_3$Sn phase is produced. Hence, an Nb$_3$Sn superconducting wire having a good superconducting property such as high Jc can be obtained.

In the method of the present invention, as the Cu-Sn-based alloy serving as the matrix, in addition to the Cu-Sn (two-component)-based alloy containing 15.1 to 24.6 wt % of Sn, an alloy obtained by causing this twocomponent-based alloy to contain about 0.1 to 0.4 wt % of Ti and so on can be used. Regarding the Nb or Nb alloy rods composed in the matrix, an Nb-Ta-based alloy containing about 7.5 wt % of Ta is used as the Nb alloy.

In the method of the present invention, the composite billet obtained by composing Nb rods or the like in the Cu-Sn-based alloy matrix is hot-worked by extrusion or rolling, and is then cold-worked to a composite wire having a predetermined shape by rolling, swaging, or drawing. Warm working is performed at a temperature less than a recrystallization temperature (preferably more than 350° C.). Cold working should not be necessarily performed at room temperature, but may be carried out at a somewhat higher temperature.

A temperature for hot working described above e.g., extrusion and rolling, need be controlled to a low level, e.g., 700° to 750° C. in order to prevent precipitation of an $Nb_3Sn$ phase. Cold working e.g., drawing is set to have an area reduction rate of 40% or less. Preferably, after each area reduction rate of 10 to 20% by cold working, intermediate annealing at 500° to 650° C. is performed. This is because if the area reduction rate exceeds 40%, it is difficult to perform the cold working, and if the intermediate annealing temperature is less than 500° C., the material is softened for the cold working; if it exceeds 650° C., $Nb_3Sn$ is produced. An intermediate annealing time preferably falls within a range of 30 minutes to 3 hours.

When the composite wire obtained in the above manner is heated at a high temperature of about 700° C. for a long time, Sb and Nb in the Cu-Sn-based alloy are diffused to react to each other to produce an $Nb_3Sn$ phase, thus providing an $Nb_3Sn$ superconducting wire.

In the method of the present invention, the Sn content in the Cu-Sn-based alloy serving as the matrix is limited to a range of 15.1 to 24.6 wt % from the following reason. If the Sn content is less than 15.1 wt %, the amount of $Nb_3Sn$ phases produced by heating is not sufficient and the superconducting property, e.g., Jc (critical current density) is not improved. If the Sn content exceeds 24.6 wt %, workability of the Cu-Sn-based alloy is degraded and a defect such as cracking occurs in the bronze layer during drawing.

In the method of the present invention, a multi-core superconducting composite billet is obtained by filling superconducting wires in a pure Cu pipe having an Nb or Ta barrier layer on the inside surface thereof. The method of drawing the multi-core superconducting composite billet described above to a multi-core composite wire and the method of heating the composite wire are as described above.

According to the present invention, since the Sn content of the Cu-Sn-based alloy, i.e., the bronze layer serving as the supply source of the Sn is high, the $\delta$-phase precipitates in the $\alpha$-phase in the Cu-Sn-based alloy. The precipitate is diffused to disappear in the final heating process and to produce $Nb_3Sn$.

The present invention will be described in detail by way of its examples.

EXAMPLE 1

A Cu-Sn-based alloy containing 15.2 wt % of Sn and 0.2 wt % of Ti was melted in vacuum and casted in a mold to form a cast article. The outer portion of the cast article was cut to remove an Sn rich layer. Then, the cast article was subjected to the HIP process to eliminate the internal blow holes and shrinkage cavities, thus forming a billet having an outer diameter of 60 mm. A through hole having a diameter of 30 mm was formed at the central portion of this billet, and a rod constituted by an Nb-7.5 wt % Ta-based alloy was inserted in this through hole. Before insertion, an oxide-free copper tape having a thickness of 0.5 mm was wound on the rod by one turn. A lid made of oxide-free copper and a lid of the same material as that of the billet were respectively applied on two ends of the billet. After evacuation, these lids were welded by electron beams to be sealed, thus forming a composite billet. The composite bilet was subjected to extrusion processing starting from the end portion of the oxide-free copper lid to form a rod having an outer diameter of 14 mm. The extrusion temperature was 730° C. and the taper angle of the extrusion die was 60°.

After extrusion, the structures of the outermost bronze layer were examined. Although the $\delta$-phase was extended in the extruding direction and dispersed, no defect such as cracks was not observed.

The extruded rod was rolled by a fluted roll by cold working to form a hexagonal superconductor wire having a distance of 2 mm between its opposing sides. After each area reduction rate of 40% by cold working, intermediate annealing at 600° to 650° C. was performed for 1 hour. When the interior of the resultant superconductor wire was observed, Sn diffusion was confirmed in the bronze side of the oxide-free copper tape intervened between the bronze layer and the Nb rod. However, $Nb_3Sn$ was not confirmed on the surface of the Nb rod.

5,000 hexagonal superconductor wires thus obtained were set in a Cu-14 wt % Sn-based alloy pipe having outer and inner diameters of 230 mm and 200 mm, respectively, to form a multi-core composite billet. An oxide-free copper rod filled in an Nb barrier pipe having outer and inner diameters of 50 mm and 46 mm, respectively, was arranged at the central portion of the pipe as a stabilizing member.

This composite billet was subjected to hot extrusion at 650° C. to form an extruded member having an outer diameter of 60 mm. This extruded member was subjected to swaging and drawing to form a multi-core composite having an outer diameter of 0.7 mm while intermediate annealing at 500° to 550° C. wa performed every area reduction rate of 15%. Finally, the multicore composite wire was heated at 700° C. for 48 hour to diffuse Sn in Nb, thus forming a multi-core superconducting wire of Example 1.

Examples 2 and 3

Multi-core $Nb_3Sn$ superconducting wires of Examples 2 and 3 were obtained by following the same procedures as in Example 1 except that Cu-Sn-based alloys having Sn contents shown in the following Table 1 were respectively used. Regarding a sample having an Sn content of 24 wt %, it was heated to 400° during rolling with a fluted roll, and drawing using a carbon lubricant.

Intermediate annealing is unnecessary for this working.

Comparative Example 1

A multi-core superconducting wire of Comparative Example 1 was obtained by following the same procedures as in Example 1 except that the Sn content in the Cu-Sn-based alloy of the Cu-Sn-based alloy billet was set to 14 wt %.

The critical current density (Jc) of each of the $Nb_3Sn$ superconducting wires of Examples 1 to 3 and Comparative Example 1 was measured in liquid He and in a magnetic field of 12 tesla. Table 1 shows the results.

TABLE 1

|  | Sn content in bronze layer (wt %) | HIP process in final stage | Jc (A/mm$^2$) |
| --- | --- | --- | --- |
| Example 1 | 15.2 | No | 680 |
| Example 2 | 19.0 | No | 750 |
| Example 3 | 24.0 | No | 790 |
| Comparative Example 1 | 14.0 | No | 450 |

As is apparent from Table 1, each of the $Nb_3Sn$ superconducting wires (Examples 1 to 3) obtained by the method of the present invention had a large Jc value. The higher the Sn content in the Cu-Sn-based alloy billet, i.e., in the bronze layer, the larger the Jc value.

In contrast to this, since the $Nb_3Sn$ superconducting wire (Comparative Example 1) obtained by the conventional method had a low Sn content in the bronze layer, the amount of produced $Nb_3Sn$ phase was small and the Jc value was considerably small.

Examples 4-6

Cu-Sn-based alloys respectively containing 16.3 wt %, 18.3 wt %, and 20.3 wt % of Sn were melted and cast to obtain cast articles. The structures of these cast articles were examined. It was confirmed that both the α- and δ-phases existed in all the cast articles. These cast articles were subjected to the processing procedures as in Example 1 to form individual composite billets and were then subjected to hot extrusion to form rods each having an outer diameter of 14 mm. At this time, when the structures of the respective bronze layers were examined, the δ-phases extended fibrously in the extruding direction in all the rods.

Each of the extruded rods was subjected to rolling with a fluted roll by cold working to form a hexagonal superconductor wire having a distance of 2 mm between its opposing sides. Cold working was performed at a temperature and an area reduction rate shown in the following Table 2. After each working intermediate annealing at 650° C. was performed for 1 hour. At this time, the δ-phase was extended in extruding direction by hot working, jointed to a new α-phase at its interface in an Sn-equilibrium state by annealing, and finally divided into small pieces as its area was reduced by cold working.

Using the respective hexagonal superconductor wires obtained in these manners, multi-core $Nb_3Sn$ superconducting wires of Examples 4 to 6 were obtained by following the same procedures as in Example 1. Regarding Example 6 (Sn content: 20.3 wt %), since this sample could not be subjected to cold working in room temperature, it was heated to 400° C. to be subjected to warm working.

Comparative Examples 2 and 3

Multi-core $Nb_3Sn$ superconducting wires were obtained by following the same procedures as in Embodiments 4 to 6 except that the Sn contents were set to 14.3 wt % and 25.0 wt %, respectively. Regarding Comparative Example 3, since the Sn content in the Cu-Sn-based alloy was excessive, the sample could not be processed even when the temperature for cold working was set to 400° C.

The critical current density (Jc) of each of the $Nb_3Sn$ superconducting wires of Example 4 to 6 and Comparative Examples 2 and 3 was measured in liquid He and in a magnetic field of 12 tesla. Table 2 shows the results.

TABLE 2

|  | Sn content in bronze layer (wt %) | Processing temperature | Area reduction rate (%) | Jc (A/mm$^2$) |
| --- | --- | --- | --- | --- |
| Example 4 | 16.3 | room temperature | 40 | 700 |
| Example 5 | 18.3 | room temperature | 20 | 720 |
| Example 6 | 20.3 | 400 | — | 780 |
| Comparative Example 2 | 14.3 | room temperature | 40 | 450 |
| Comparative Example 3 | 25.0 | 400 | 20 | |

As is apparent from Table 2, each of the $Nb_3Sn$ superconducting wires (Examples 4 to 6) obtained by the method of the present invention had a large Jc value.

In contrast of this, since the $Nb_3Sn$ superconducting wire (Comparative Example 2) obtained by the conventional method had a low Sn content in the bronze layer, the amount of produced $Nb_3Sn$ phase was small and the Jc value was small. The sample (Comparative Example 3) using an Cu-Sn-based alloy containing Sn in an amount falling outside the range of the present invention could not be processed as its Sn content was excessive.

As has been described above, according to the method of the present invention, an $Nb_3Sn$ superconducting wire having an excellent superconducting property, e.g., a high Jc can be obtained, and a remarkable industrial effect can be obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing an $Nb_3Sn$ superconducting wire, comprising the steps of:
   (a) forming a plurality of rods from a material selected from the group consisting of Nb and an Nb alloy, in a Cu-Sn-based alloy matrix having an intermetallic compound phase, containing 15.2 to 24.6 wt. % of Sn, thus preparing a composite billet having a diameter;
   (b) subjecting said composite billet from step (a) to a hot working;
   (c) subjecting said composite billet from step (b) to a cold or warm working to reduce the diameter and annealing repeatedly to divide an intermetallic compound phase in the Cu-Sn-based alloy into small pieces, thus obtaining a composite wire; and
   (d) heating said composite wire at a temperature whereby to diffuse Sn into the Nb.
2. The method according to claim 1, wherein the Cu-Sn-based alloy contains 15.2 to 18.5 wt % of Sn.

3. The method according to claim 1, wherein the Cu-Sn-based alloy contains 15.2 to 16.5 wt % of Sn, and an area reduction rate in cold working is not more than 40%.

4. The method according to claim 1, wherein the Cu-Sn-based alloy contains 15.2 to 18.5 wt % of Sn, and an area reduction rate in cold working is not more than 20%.

5. The method according to claim 4, wherein the hot working is carried out at a temperature of 700° C.; the warm working is carried out at a temperature of not less than 350° C. and not more than the recrystallization temperature of the Cu-Sn-based alloy; and the annealing is carried out at a temperature of 500° to 650° C. for a period of time of 30 minutes to 3 hours.

6. The method of claim 5, wherein the material is an Nb alloy, said Nb alloy being an Nb-Ta-based alloy containing 7.5 wt.% of Ta and the Cu-Sn-based alloy contains 0.1 to 0.4 wt.% Ti.

7. The method according to claim 1, wherein the Cu-Sn-based alloy contains 18.5 to 24.6 wt % of Sn, and warm working to reduce the diameter is performed at a temperature not less than 350° C. and not more than a recrystallization temperature of the Cu-Sn-based alloy.

8. The method according to claim 1, wherein the intermetallic compound phase of the Cu-Sn-based alloy is a $\delta$-phase.

9. The method according to claim 1, wherein the annealing is performed at a temperature of 500° C. to 650° C.

10. The method according to claim 9, wherein the annealing is carried out for a period of 30 minutes to 3 hours.

11. The method according to claim 1, wherein the material is an Nb alloy, and Nb alloy being an Nb-Ta-based alloy containing 7.5 wt.% of Ta and the Cu-Sn-based alloy contains 0.1 to 0.4 wt.% Ti.

12. A method of manufacturing an $Nb_3Sn$ superconducting wire, comprising the steps of:
(a) forming a plurality of rods from a material selected from the group consisting of Nb and an Nb alloy, in a Cu-Sn-based alloy matrix having an intermetallic compound phase, containing 15.2 to 24.6 wt. % of Sn, thus preparing a composite billet having a diameter;
(b) subjecting said composite billet from step (a) to a hot working;
(c) subjecting said composite billet from step (b) to a cold or warm working to reduce the diameter and annealing repeatedly to divide the intermetallic compound phase in the Cu-Sn-based alloy into small pieces, thus obtaining a composite wire; and
(d) inserting a plurality of the composite wires in a pipe formed from a material selected from the group consisting of Cu and a Cu alloy, and preparing said plurality of composite wires to form a multi-core composite billet;
(e) drawing said multi-core composite billet from step (d) to obtain a multi-core composite wire; and
(f) heating said composite wire at a temperature whereby to diffuse Sn into the Nb.

13. The method according to claim 12, wherein the Cu-Sn-based alloy contains 15.2 to 18.5 wt % of Sn.

14. The method according to claim 12, wherein the Cu-Sn-based alloy contains 15.2 to 16.5 wt % of Sn, and an area reduction rate in cold working is not more than 40%.

15. The method according to claim 12, wherein the Cu-Sn-based alloy contains 15.2 to 18.5 wt % of Sn, and an area reduction rate in cold working is not more than 20%.

16. The method according to claim 15, wherein the hot working is carried out at a temperature of 700° C. to 750°; the warm working is carried out at a temperature of not less than 350° C. and not more than the recrystallization temperature of the Cu-Sn-based alloy; and the annealing is carried out at a temperature of 500° to 650° C. for a period of time of 30 minutes to 3 hours.

17. The method according to claim 15, wherein the Cu-Sn-based alloy contains 18.5 to 24.6 wt % of Sn, and warm working to reduce the diameter is performed at a temperature not less than 350° C. and not more than a recrystallization temperature of the Cu-Sn-based alloy.

18. The method according to claim 12, wherein the intermetallic compound phase of the Cu-Sn-based alloy is a $\delta$-phase.

19. The method according to claim 12, wherein the annealing is performed at a temperature of 500° C. to 650° C.

20. The method according to claim 19, wherein the annealing is carried out for a period of 30 minutes to 3 hours.

* * * * *